(12) United States Patent
Fan et al.

(10) Patent No.: US 7,327,174 B2
(45) Date of Patent: Feb. 5, 2008

(54) FAST LOCKING MECHANISM FOR DELAY LOCK LOOPS AND PHASE LOCK LOOPS

(75) Inventors: Yongping Fan, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/374,808

(22) Filed: Mar. 14, 2006

(65) Prior Publication Data

US 2007/0216454 A1    Sep. 20, 2007

(51) Int. Cl.
*H03L 7/06* (2006.01)
(52) U.S. Cl. .................................. 327/149; 327/158
(58) Field of Classification Search ................ 327/148, 327/149, 150, 157, 158; 375/373–376; 331/17, 331/25, DIG. 2
See application file for complete search history.

(56) References Cited

U.S. PATENT DOCUMENTS

| | | | |
|---|---|---|---|
| 6,249,164 B1 | 6/2001 | Cranford, Jr. et al. ...... 327/270 |
| 6,563,387 B2 * | 5/2003 | Hirano et al. ................. 331/11 |
| 6,621,314 B2 | 9/2003 | Krishnamurty .............. 327/158 |
| 6,791,388 B2 | 9/2004 | Buchwald et al. .......... 327/248 |
| 6,943,606 B2 | 9/2005 | Dunning et al. ............ 327/231 |
| 2004/0263227 A1 * | 12/2004 | Baker et al. ................. 327/158 |
| 2005/0073344 A1 * | 4/2005 | Furuya ........................ 327/158 |

OTHER PUBLICATIONS

Kreienkamp, R. et al., "A 10-Gb/s CMOS Clock and Data Recovery Circuit With an Analog Phase Interpolator," IEEE Journal of Solid-State Circuits, vol. 40, No. 3, Mar. 2005, pp. 736-743.
U.S. Appl. No. 11/232,840, filed Sep. 21, 2005.
U.S. Appl. No. 11/319,879, filed Dec. 27, 2005.

* cited by examiner

*Primary Examiner*—Linh My Nguyen
(74) *Attorney, Agent, or Firm*—Blakely, Sokoloff, Taylor & Zafman LLP (57) ABSTRACT

A fast lock mechanism for delay lock loops and phase lock loops. A first circuit is coupled to receive an input clock signal and to generate an output clock signal responsive to the input clock signal. The first circuit includes a charge pump and delay cells. The charge pump generates an operational bias voltage during operation of the first circuit to control a delay of the delay cells. A fast lock circuit is coupled to an output of the charge pump to precharge the output of the charge pump with a startup bias voltage prior to enabling the charge pump.

19 Claims, 7 Drawing Sheets

FAST LOCKING MECHANISM FOR DELAY LOCK LOOPS AND PHASE LOCK LOOPS

TECHNICAL FIELD

This disclosure relates generally to electronic circuits, and in particular but not exclusively, relates to a fast locking mechanism for use with delay lock loops and phase lock loops.

BACKGROUND INFORMATION

A delay lock loop ("DLL") is an electronic circuit that takes an input signal and outputs a plurality of phase delayed signals each having the same frequency as the input signal but each being phased delayed by some amount. The phase delayed signals may have any configured phase delay, but typically have evenly spaced phase delays ranging between 0° and 360°. DLLs may be used in a variety of circuits, such as communication circuits and input/output ("I/O") circuitry (e.g., receiver and driver circuitry). For example, DLLs may be used in receiver circuitry for adjusting the sampling phase of the receiver.

A phase lock loop ("PLL") is an electronic circuit which typically includes a voltage controlled or current controlled oscillator that is constantly adjusted to match the frequency (and thus lock on) of an input clock signal. PLLs are also commonly used in communication circuit and I/O circuitry to implement a variety of functions. For example, PLLs are used to generate clock signals, to extract clock signals from an incoming data streams, to modulate and demodulate signals, to reconstitute signals with less noise, to multiple or divide frequencies, or otherwise.

When initially turned on, conventional DLLs and PLLs require a certain minimum amount of time to stabilize and acquire a feedback lock on the input signal. During this transient startup phase, the output(s) of the DLL or PLL are unreliable. The typical transient startup time of conventional DLLs and PLLs can last for ≈100 ns and ≈1 ms, respectively, until the feedback loop stabilizes, thereby "acquiring lock", and entering its steady state of operation during which the output may be reliably used to drive downstream circuitry.

Waiting for expiration of the ≈100 ns transient startup time is a significant period of time in relation to modern high speed gigahertz circuits. Accordingly, when circuits including DLLs or PLLs are placed in low power sleep states, the DLLs and PLLs are often left operating—consuming power—so as to avoid cycling through the costly transient startup phase upon exiting the sleep state.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an method of operation and an apparatus of a fast lock circuit for use with a delay lock loop or a phase lock loop are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
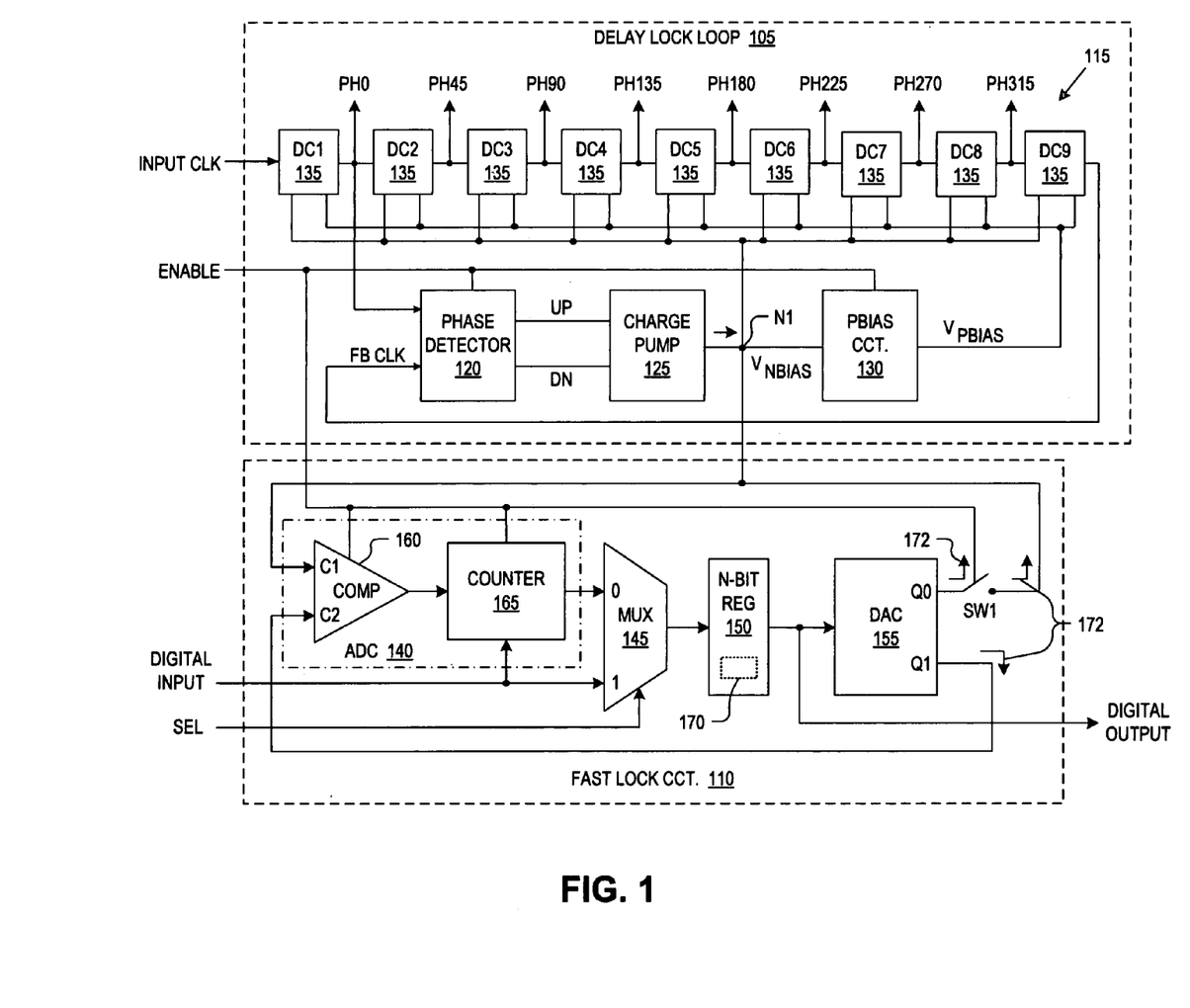
FIG. 1 is a functional block diagram illustrating a delay lock loop with a fast lock circuit, in accordance with an embodiment of the invention.

FIG. 1 is a functional block diagram illustrating a delay lock loop ("DLL") 105 with a fast lock circuit 110, in accordance with an embodiment of the invention. The illustrated embodiment of DLL 105 includes a phase detector 120, a charge pump 125, a PBIAS circuit 130, and delay cells DC1-DC9 (collectively referred to as delay cells 135). The illustrated embodiment of fast lock circuit 110 includes an analog-to-digital converter ("ADC") 140, a multiplexer ("MUX") 145, an N-bit register 150, a digital-to-analog converter ("DAC") 155, and a switch SW1. The illustrated embodiment of ADC 140 includes a comparator 160 and a counter 165.

The components of DLL 105 are interconnected as follows. Delay cells 135 are coupled in series to form a delay chain 115. Although delay chain 115 is illustrated as including nine delay cells 135, other embodiments of delay chain 115 may include more or less delay cells 135. The first one of delay cells 135 (i.e., delay cell DC1) is coupled to receive an input clock signal. As the input clock signal propagates through delay chain 115, each delay cell 135 outputs a delayed output clock signal having a corresponding phase delay. Phase detector 120 is coupled to a last one of delay cells 135 (e.g., delay cell DC9) to receive a feedback clock signal. Phase detector 120 is further coupled to the first one of delay cells 135 (e.g., delay cell DC1). Phase detector 120 outputs UP or DOWN pulses to charge pump 125 based on the phase different between its two inputs. In turn, charge pump 125 generates a bias voltage $V_{NBIAS}$ for biasing delay cells 135 of delay chain 115. $V_{NBIAS}$ is coupled into PBIAS circuit 130 which generates a second bias voltage $V_{PBIAS}$, in response to $V_{NBIAS}$ output from charge pump 125, for biasing delay cells 135 of delay chain 115.

In one embodiment, $V_{NBIAS}$ is coupled into each of delay cells 135 to adjust the conductivity of negative-type transistors within delay cells 135. The negative-type transistors may be located within pull down paths of delay cells 135 and therefore control the current strength or pull down rate of the output of each delay cell 135. Correspondingly, in one embodiment, $V_{PBIAS}$ is coupled into each of delay cells 135 to adjust the conductivity of positive-type transistors within delay cells 135. The positive-type transistors may be located within pull up paths of delay cells 135 and therefore control the current strength or pull up rate of the output of each delay cell 135. In short, $V_{NBIAS}$ output from charge pump 125 controls the speed or delay of delay chain 115.

The feedback clock output from delay cell DC9 is fed back into phase detector 120 to provide a feedback control mechanism used to acquire a phase lock between the two inputs to phase detector 120. During an initial startup phase, or transient operation, the UP/DOWN pulses from phase detector 120 cause charge pump 125 to constantly adjust $V_{NBIAS}$. Eventually, a phase lock is acquired and $V_{NBIAS}$ settles to a steady state value that remains steady or minimally fluctuates due to operating temperatures changes or other operating factors.

Figure 2:
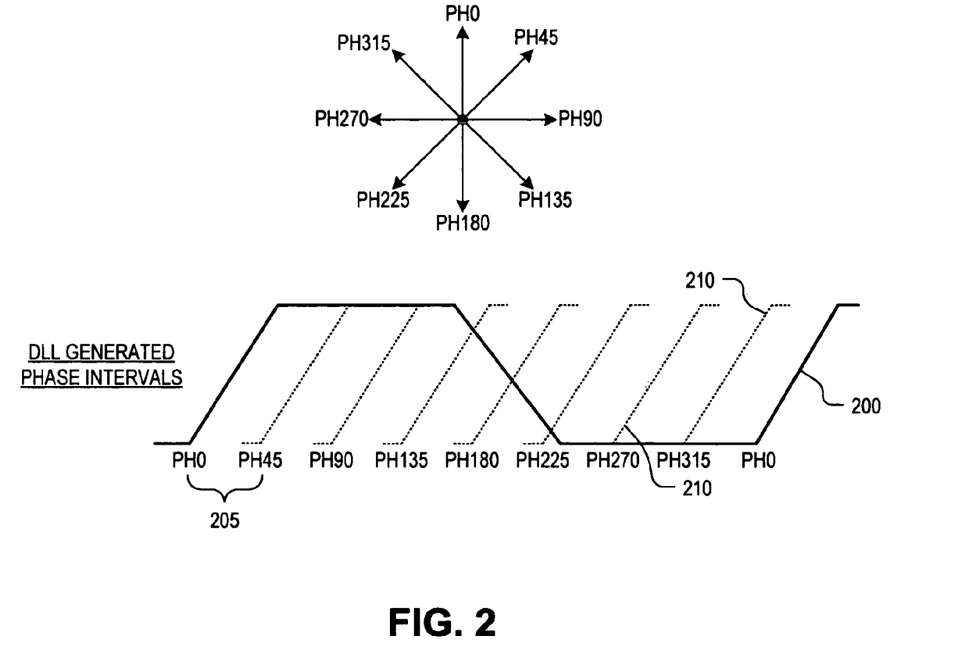
FIG. 2 includes phase diagrams illustrating the output of a delay lock loop, in accordance with an embodiment of the invention.

Referring to FIG. 2, a clock signal 200 is illustrated. Clock signal 200 corresponds to the input clock signal received at delay cell 135, illustrated in FIG. 1. Clock signal 200 is divided into eight evenly spaced phase intervals 205 (only one is labeled) ranging from 0° to 45°, 45° to 90°, 90° to 135°, 135° to 180°, 180° to 225°, 225° to 270°, 270° to 315°, and 315° to 360°. Phase delayed clock signals 210 (only a portion are labeled) having phase intervals 205 may be generated from clock signal 200 using DLL 105. Accordingly, in one embodiment, DLL 110 generates eight phase delayed clock signals 210 from clock signal 200 each having a different phase delay. Phase delayed clock signals 210 correspond to the output clock signals PH0, PH45, PH90, PH135, PH180, PH225, PH270, and PH315 illustrated in FIG. 1. It should be appreciated that DLL 105 may generate more or less phase delayed clock signals 210 and phase intervals 205 between phase delayed clock signals 210 need not be uniform.

Returning to FIG. 1, fast lock circuit 110 operates to provide a fast lock mechanism to DLL 105, as well as provide other functionality discussed below in connection with FIG. 8. Fast lock circuit 110 operates as follows. N-bit register 150 stores a digital startup value 170 and is coupled to DAC 155 to provide DAC 155 with digital startup value 170. DAC 155 converts digital startup value 170 into an analog startup bias voltage 172.

During a sleep mode (or power conservation mode) the enable input is de-asserted to turn off phase detector 120, PBIAS circuit 130, and ADC 140. Disabling phase detector 120 causes charge pump 125 and delay chain 115 to power down. In one embodiment, the only element left operating during the sleep mode is DAC 155. Deasserting the enable input during the sleep mode causes switch SW1 to close circuit and precharge node N1 (the output of charge pump 125) with analog startup bias voltage 172. Accordingly, when DLL 105 exits the sleep state, DLL 105 will commence operation from a bias voltage at node N1 determined by digital startup value 170. If digital startup value 170 has been selected to be a value that generates analog startup bias voltage 172 being close to the steady state value of $V_{NBIAS}$ after DLL 105 has acquired a phase lock, then DLL 105 will almost instantaneously acquire a phase lock upon exiting sleep mode.

Figure 3:
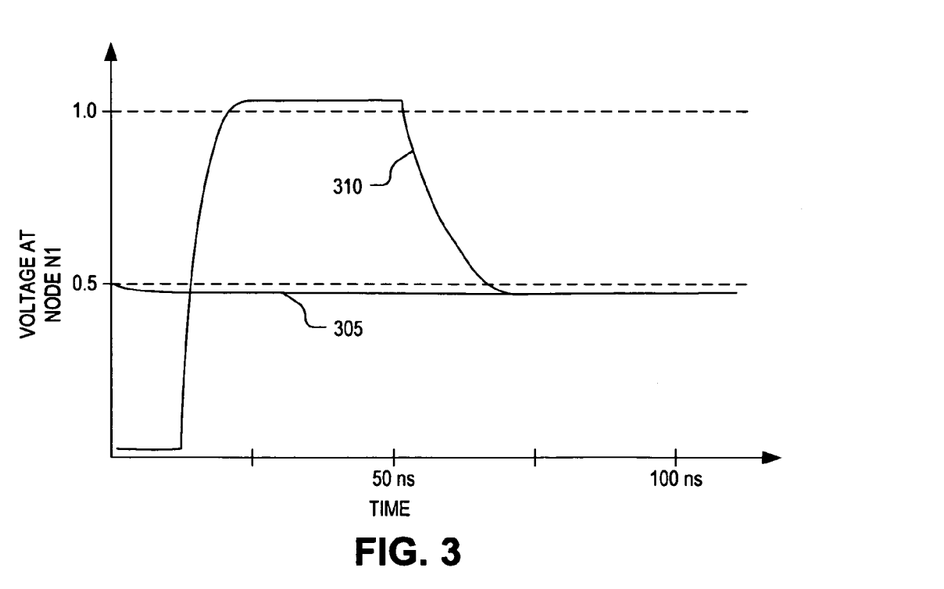
FIG. 3 is a line graph illustrating a feedback lock comparison between a conventional delay lock loop and a delay lock loop with a fast lock circuit, in accordance with an embodiment of the invention.

FIG. 3 is a line graph illustrating a phase lock comparison between a conventional DLL and DLL 105 coupled with fast lock circuit 110, in accordance with an embodiment of the invention. Line 305 illustrates how DLL 105 achieves phase lock quickly and the voltage at node N1 settles into a steady state (e.g., within 3 ns). In contrast, conventional DLLs pull the output of charge pump 125 to a VCC voltage rail to cause the conventional DLL to commence the locking process from the minimum delay, thereby preventing an unintended lock to a harmonic of the input clock signal. As illustrated, conventional DLLs may use 75 ns or more to acquire a lock and enter steady state operation.

Returning to FIG. 1, during regular steady state operation of DLL 105, switch SW1 is open circuited and DAC 155 feeds back analog startup bias voltage 172 from port Q1 to ADC 140. ADC 140 is further coupled to node N1 of DLL 105 to receive the steady state value of $V_{NBIAS}$. During regular steady state operation, fast lock circuit 110 acts to successively approximate the value of $V_{NBIAS}$ and update N-bit register 150 with an updated digital startup value 170 reflecting $V_{NBIAS}$.

The bit width 'N' of N-bit register 150 and digital startup value 170 may be selected depending upon the desired resolution or accuracy, circuit area constraints, power requirements or goals, and the like. For example, 'N' may range between 4 to 8 bits for typical applications; however, smaller or greater bit widths for digital startup value 170 may be used.

Figure 4:
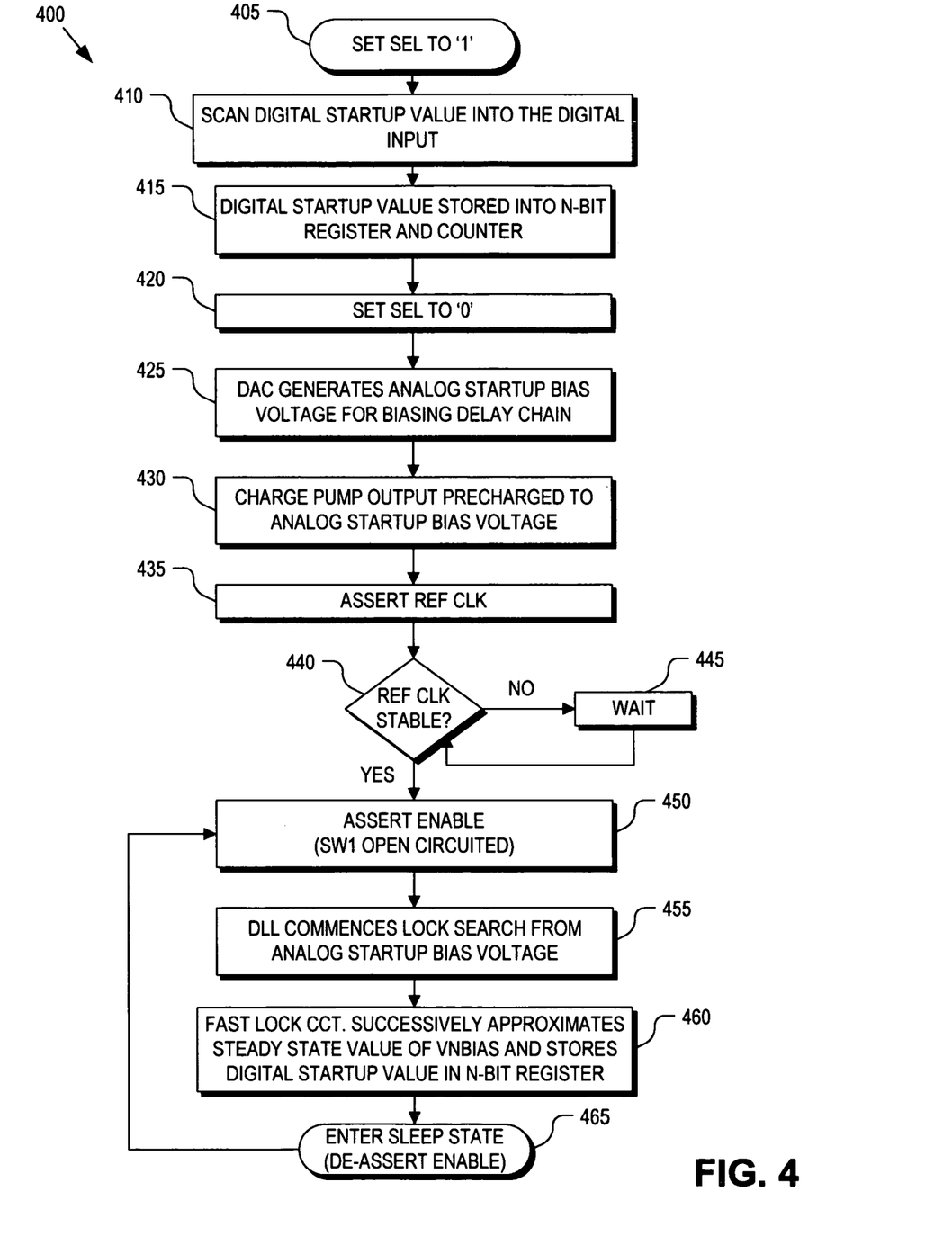
FIG. 4 is a flow chart illustrating a process of for a fast lock circuit coupled to a delay lock loop or a phase lock loop, in accordance with an embodiment of the invention.

FIG. 4 is a flow chart illustrating a process 400 for operation of DLL 105 with fast lock circuit 110, in accordance with an embodiment of the invention. The order in which some or all of the process blocks appear in process 400 should not be deemed limiting. Rather, one of ordinary skill in the art having the benefit of the present disclosure will understand that some of the process blocks may be executed in a variety of orders not illustrated.

Prior to initial use of DLL 105 (or at any other time), an initial value for digital startup value 170 may be externally scanned into N-bit register 150 using the digital input coupled to MUX 145 (see FIG. 1). In a process block 405, the select input ("SEL") of MUX 145 is set to '1', thereby selecting the digital input. With SEL set to '1', the new digital startup value 170 is scanned into the digital input (process block 410) and stored within N-bit register 150 (process block 415). As illustrated, the new digital startup value 170 is also scanned into counter 165 at the same time. In one embodiment, MUX 145 and N-bit register 150 may both be integrated into counter 165 and therefore the new digital startup value 170 need only be scanned into counter 165 or a register integrated within counter 165.

In a process block 420, SEL is set to '0', thereby selecting counter 165. With N-bit register 150 storing digital startup value 170, DAC 155 converts digital startup value 170 into an analog value to generate startup bias voltage 172 (process block 425). Since the enable input is initially de-asserted to disable DLL 105 prior to regular operation, switch SW1 is closed circuited and the output of DAC 155 precharges the output of charge pump 125 (i.e., node N1) with startup bias voltage 172 (process block 430).

Prior to commencing regular operation of DLL 105 to generate the plurality of phase delayed signals, the input clock signal is asserted (process block 435) and allowed to stabilize (decision block 440 and process block 445). Once the input clock signal has stabilized (decision block 440), the enable input is asserted to exit the sleep state and commence regular operation of DLL 105 (process block 450). Asserting the enable input open circuits switch SW1, decoupling node N1 from the output of DAC 155 and freeing charge pump 125 to takeover control of $V_{NBIAS}$ and the biasing of delay chain 115.

Once DLL 105 is released from fast lock circuit 110 by open circuiting switch SW1, DLL 105 commences a lock search (process block 455). However, because the node N1 was pre-charged by fast lock circuit 110, the lock search commences from the startup bias voltage 172 provided by fast lock circuit 110. Pre-charging node N1 can dramatically reduce the lock search time (or transient phase) of DLL 105, as illustrated by line 305 in FIG. 3.

Once DLL 105 has entered regular steady state operation, fast lock circuit 110 commences successive approximation of the operational bias voltage $V_{NBIAS}$ output by charge pump 125 to update digital startup value 170 (process block 460). The updated digital startup value 170 will then be used the next time DLL 105 is placed into a sleep state (or total shut down) and exits therefrom. In a process block 465, DLL 105 and fast lock circuit 110 re-enter the sleep state upon de-asserting the enable input.

Figure 5:
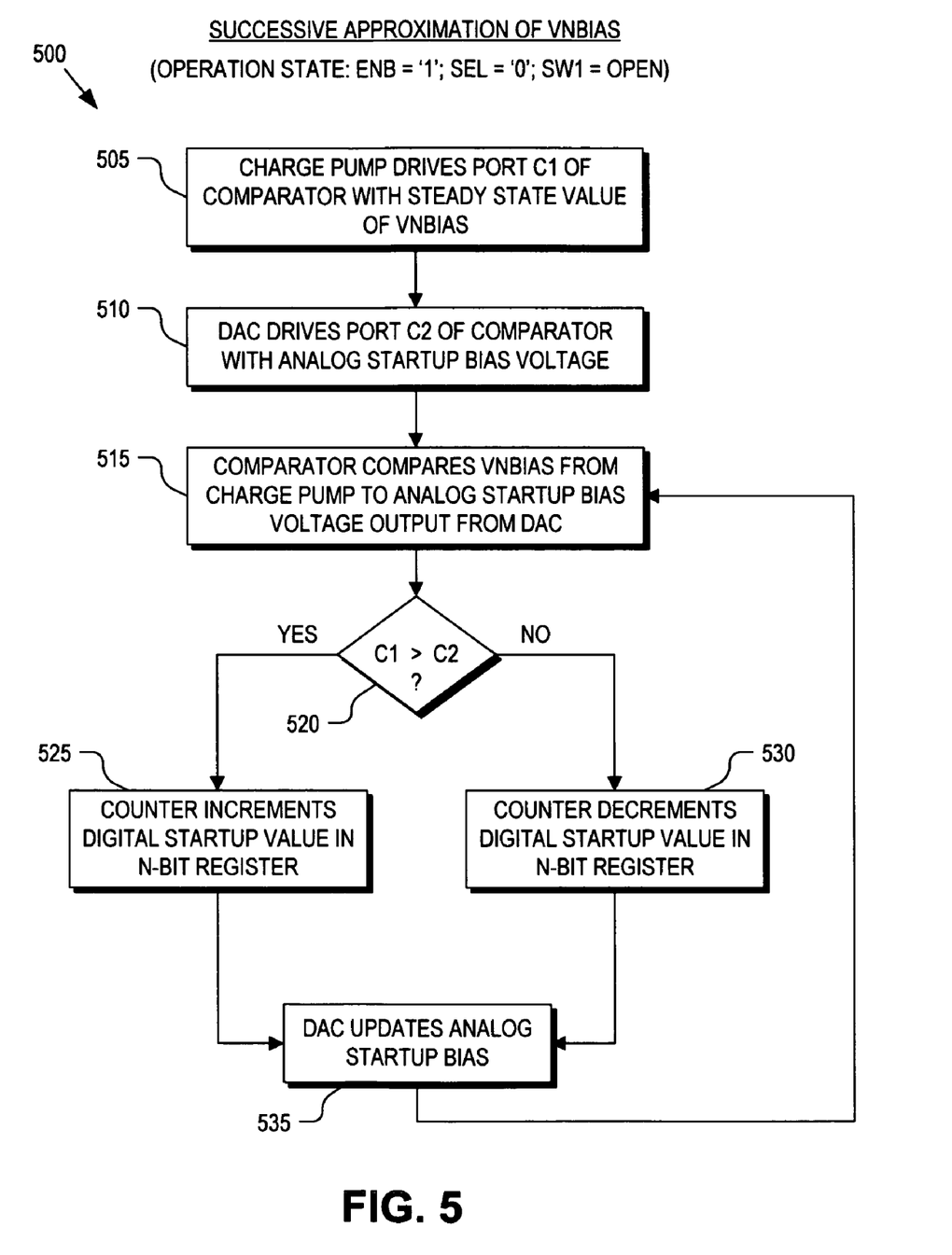
FIG. 5 is a flow chart illustrating a process of successive approximation for registering a digital startup value for use with a fast lock circuit, in accordance with an embodiment of the invention.

FIG. 5 is a flow chart illustrating a process 500 of successive approximation for registering an updated digital startup value 170 within N-bit register 150, in accordance with an embodiment of the invention. The order in which some or all of the process blocks appear in process 500 should not be deemed limiting.

As discussed above, port C1 of comparator 160 is coupled to node N1 to receive the operational bias voltage $V_{NBIAS}$ output by charge pump 125. In a process block 505, charge pump 125 drives port C1 with the steady state value of operational bias voltage $V_{NBIAS}$. Comparator 160 is further coupled to DAC 155 to receive analog startup bias voltage 172 at port C2 (process block 510). In a process block 515, comparator 160 compares analog startup bias voltage 172 output from DAC 155 to the operational bias voltage $V_{NBIAS}$ generated by charge pump 125. Depending upon whether analog startup bias voltage 172 is greater than or less than the operational bias voltage $V_{NBIAS}$, comparator 160 outputs a '0' or a '1' causing counter 165 to increment or decrement digital startup value 170 (decision block 520).

If $V_{NBIAS}$ received on port C1 is greater than analog startup bias voltage 172 received on port C2, then process 500 continues to a process block 525. In process block 525, counter 165 increments digital startup value 170 and stores the updated value in N-bit register 150. However, if $V_{NBIAS}$ received on port C1 is less than analog startup bias voltage 172 received on port C2, then process 500 continues to a process block 530. In process block 530, counter 165 decrements digital startup value 170 and stores the updated value in N-bit register 150. In a process block 535, DAC 155 converts the updated digital startup value 170 into an updated analog startup bias voltage 172. Process 500 then loops back to process block 515 and continues from there as described above.

Figure 6:
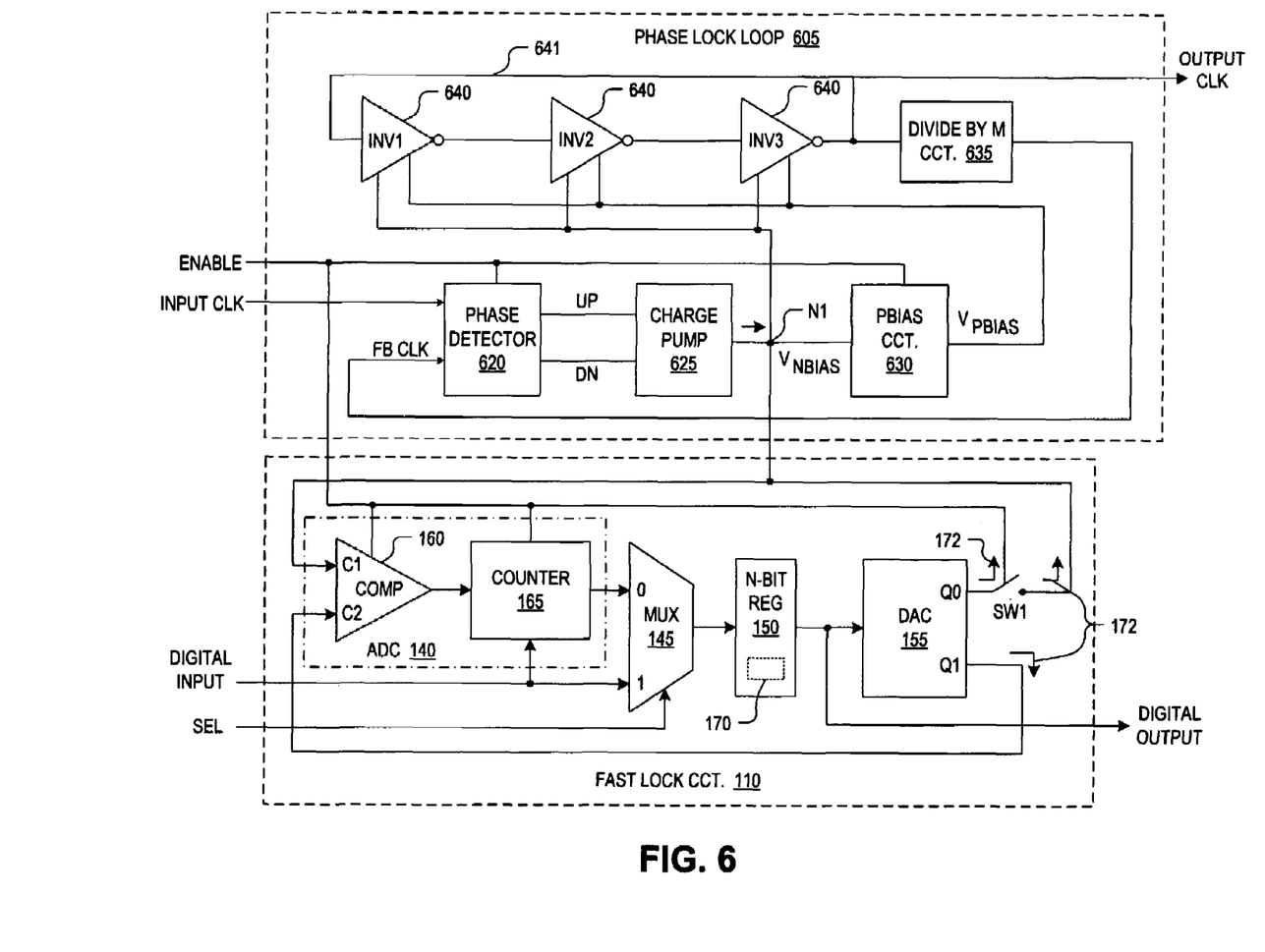
FIG. 6 is a functional block diagram illustrating a phase lock loop with a fast lock circuit, in accordance with an embodiment of the invention.

FIG. 6 is a functional block diagram illustrating a phase lock loop ("PLL") 605 coupled with fast lock circuit 110, in accordance with an embodiment of the invention. FIG. 6 illustrates that fast lock circuit 110 may be used with either a DLL or a PLL and operates in the same manner as discussed in connection with processes 400 and 500.

The illustrated embodiment of PLL 605 includes a phase detector 620 (commonly referred to as a phase frequency detector), a charge pump 625, a PBIAS circuit 630, a divide by M circuit 635, and delay cells 640 coupled in a loop. The illustrated embodiment of delay cells 640 comprise inverters coupled in series with a feedback path 641 coupling the output of a last one of delay cells 640 (i.e., inverter INV3) to the input of a first one of delay cells 640 (i.e., inverter INV1). The output of inverter INV3 is further coupled to divide by M circuit 635, which in turn couples a feedback clock signal back to phase detector 620. Although FIG. 6 illustrates three delay cells 640, embodiments of PLL 605 may include more or less series coupled delay cells 640, as long as the total number of delay cells 640 is a positive odd number. Phase detector 620, charge pump 625, and PBIAS circuit 630 operate in a similar manner as phase detector 120, charge pump 125, and PBIAS circuit 130, respectively, discussed in connection with DLL 105. The illustrated embodiment of PLL 605 includes the output clock signal at being tapped off of the output of inverter INV3; however, the output clock signal may also be tapped off from the feedback clock signal input into phase detector 620 from divide by M circuit 635.

Delay cells 640 operate as a voltage controlled oscillator ("VCO") with the frequency of oscillation being controlled by charge pump 625 and $V_{NBIAS}$ and $V_{PBIAS}$. By adjusting the operational bias voltage $V_{NBIAS}$ output from charge pump 625, the delay associated with each delay cell 640 stage is adjusted, resulting in a total combined frequency change for the VCO.

Figure 7:
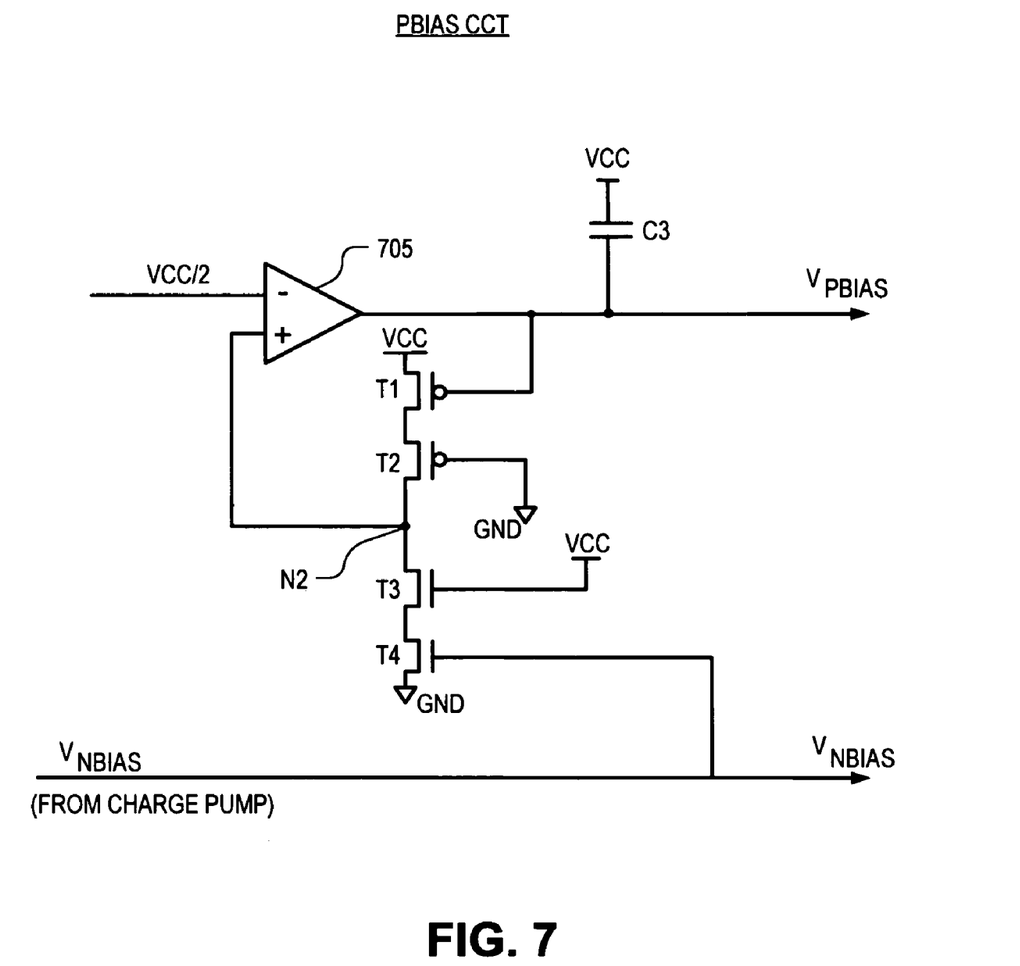
FIG. 7 is a circuit diagram illustrating a PBIAS circuit for generating a PBIAS voltage to bias positive-type transistors in delay cells of a delay lock loop or a phase lock loop, in accordance with an embodiment of the invention.

FIG. 7 is a circuit diagram illustrating a PBIAS circuit 730 for generating the bias voltage $V_{PBIAS}$ to bias positive-type transistors in delay cells 135 or delay cells 640, in accordance with an embodiment of the invention. PBIAS circuit 730 illustrates one possible embodiment for PBIAS circuit 130 or PBIAS circuit 630.

The illustrated embodiment of PBIAS circuit 730 includes a operational amplifier ("OPAMP") 705 and transistors T1, T2, T3, and T4 coupled in series between the high voltage rail VCC and the low voltage rail GND. The negative input of OPAMP 705 is coupled to receive a voltage equal to half the voltage supplied by the high voltage rail (i.e., VCC/2). A simple voltage divider circuit may be used to generate VCC/2. The positive input of OPAMP 705 is coupled to an intermediate node N2 between the drains of transistor T2 and T3. The gate of transistor T1 is coupled to the output of OPAMP 705, the gate of transistor T2 is coupled to the low voltage rail, the gate of transistor T3 is coupled to the high voltage rail, and the gate of transistor T4 is coupled to receive the operational bias voltage $V_{NBIAS}$ from charge pump 125 or charge pump 625. A capacitor C3 may further be coupled between the output of OPAMP 705 and the high voltage rail VCC for filtering.

Figure 8:
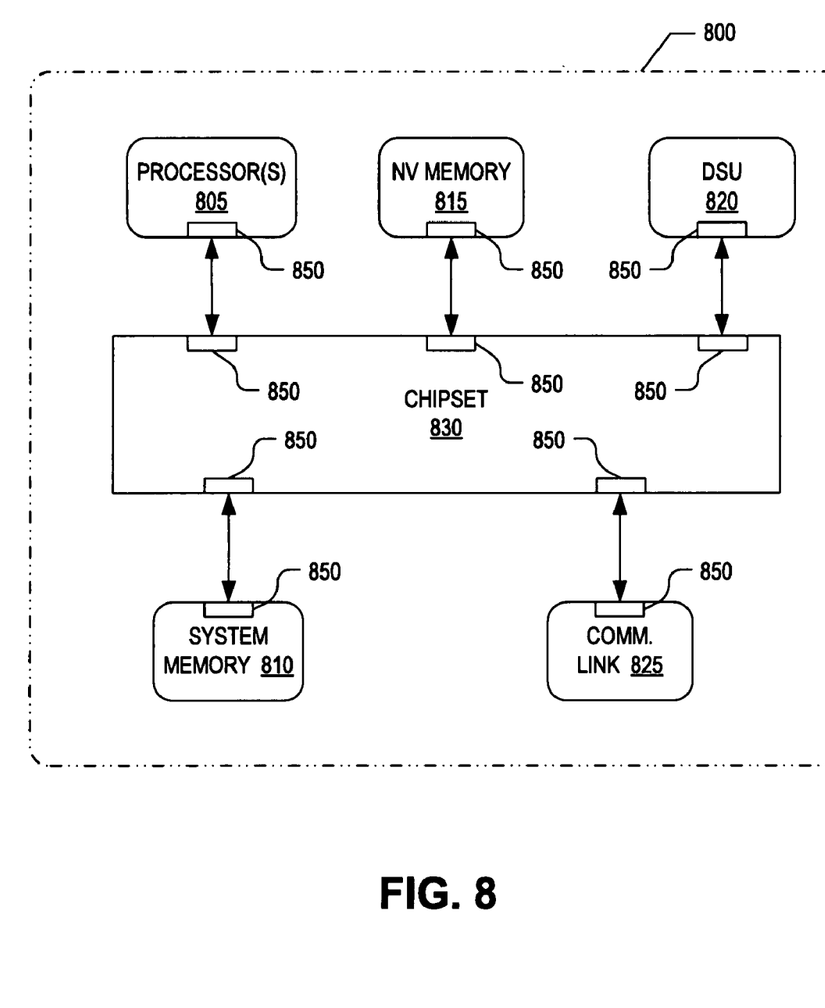
FIG. 8 is a functional block diagram illustrating a demonstrative system implemented with embodiments of the invention.

FIG. 8 is a functional block diagram illustrating a demonstrative system 800 implemented with embodiments of the invention. The illustrated embodiment of processing system 800 includes one or more processors (or central processing units) 805, system memory 810, nonvolatile ("NV") memory 815, a data storage unit ("DSU") 820, a communication link 825, and a chipset 830. The illustrated processing system 800 may represent any computing system including a desktop computer, a notebook computer, a workstation, a handheld computer, a server, a blade server, or the like.

The elements of processing system 800 are interconnected as follows. Processor(s) 805 is communicatively coupled to system memory 810, NV memory 815, DSU 820, and communication link 825, via chipset 830 to send and to receive instructions or data thereto/therefrom. In one embodiment, NV memory 815 is a flash memory device. In other embodiments, NV memory 815 includes any one of read only memory ("ROM"), programmable ROM, erasable programmable ROM, electrically erasable programmable ROM, or the like. In one embodiment, system memory 810 includes random access memory ("RAM"), such as dynamic RAM ("DRAM"), synchronous DRAM, ("SDRAM"), double data rate SDRAM ("DDR SDRAM"), static RAM ("SRAM"), and the like. DSU 820 represents any storage device for software data, applications, and/or operating systems, but will most typically be a nonvolatile storage device. DSU 820 may optionally include one or more of an integrated drive electronic ("IDE") hard disk, an enhanced IDE ("EIDE") hard disk, a redundant array of independent disks ("RAID"), a small computer system interface ("SCSI") hard disk, and the like. Although DSU 820 is illustrated as internal to processing system 800, DSU 820 may be externally coupled to processing system 800. Communication link 825 may couple processing system 800 to a network such that processing system 800 may communicate over the network with one or more other computers. Communication link 825 may include a modem, an Ethernet card, a Gigabit Ethernet card, Universal Serial Bus ("USB") port, a wireless network interface card, a fiber optic interface, or the like.

Referring to FIGS. 1 and 6, digital startup value 170 is a reasonably accurate measure of chip process, voltage, and temperature ("PVT") conditions. As such, digital startup value 170 may be referred to as the PVT value of a chip. In addition to using the PVT value to precharge node N1, as discussed above, the PVT value can be used to provide PVT compensation for other circuit blocks, such impedance matching circuitry to adjust on-die termination resistors, driver circuitry to adjust slew rate, and the like.

As illustrated in FIG. 8, each of the subcomponents of processing system 800 includes input/output ("I/O") circuitry 850 for communication with each other. I/O circuitry 850 may include impedance matching circuitry that may be adjusted to achieve a desired input impedance thereby reducing signal reflections and interference between the subcomponents. In one embodiment, DLL 105 and fast lock circuit 110 may be including within I/O circuitry 850. In one embodiment, digital startup value 170 (the PVT value) output from the digital output (see FIGS. 1 and 6) may be used as a compensation signal for adjusting the impedance matching circuitry.

I/O circuitry 850 may further include signal drivers. In one embodiment, digital startup value 170 may be used as a compensation signal to adjust the drive strength or the drive current of the drivers within I/O circuitry 850 to achieve a desired slew rate. Using fast lock circuit 110 to provide a PVT value for a chip can replace the use of external reference resistors currently used for PVT compensation, thereby reducing the pin count on a chip. The PVT value may further be useful for debugging test chips after tape out, as well as other purposes.

It should be appreciated that various other elements of processing system 800 have been excluded from FIG. 8 and this discussion for the purposes of clarity. For example, processing system 800 may further include a graphics card, additional DSUs, other persistent data storage devices (e.g., tape drive), and the like. Chipset 830 may also include a system bus and various other data buses for interconnecting subcomponents, such as a memory controller hub and an input/output ("I/O") controller hub, as well as, include data buses (e.g., peripheral component interconnect bus) for connecting peripheral devices to chipset 830. Correspondingly, processing system 800 may operate without one or more of the elements illustrated. For example, processing system 800 need not include DSU 820.

DLL 105, PLL 605, and fast lock circuit 110 may be incorporated into various integrated circuits. Furthermore, descriptions of DLL 105, PLL 605, and fast lock circuit 110 may be generated and compiled for incorporation into other integrated circuits. For example, behavioral level code describing DLL 105, PLL 605, and fast lock circuit 110, or portions thereof, may be generated using a hardware descriptive language, such as VHDL or Verilog, and stored to a machine-accessible medium. Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe DLL 105, PLL 605, and fast lock circuit 110.

A machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.), as well as electrical, optical, acoustical or other forms of propagated signals (e.g., carrier waves, infrared signals, digital signals, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
  a first circuit to receive an input clock signal and to generate an output clock signal responsive to the input clock signal, the first circuit including a charge pump and delay cells, the charge pump coupled to generate an operational bias voltage during operation of the first circuit to control a delay of the delay cells; and
  a fast lock circuit coupled to an output of the charge pump to precharge the output of the charge pump with a startup bias voltage prior to enabling the charge pump, the fast lock circuit including:
    an N-bit register to store a digital startup value; and
    a digital-to-analog converter ("DAC") coupled to the N-bit register to convert the digital startup value to the startup bias voltage.

2. The apparatus of claim 1, wherein the fast lock circuit further includes an analog-to-digital converter ("ADC") circuit coupled to the output of the charge pump and to an output of the DAC, the ADC coupled to compare the operational bias voltage to the startup bias voltage, the ADC further coupled to the N-bit register to update the digital startup value with a successively approximated value of the operational bias voltage.

3. The apparatus of claim 2, wherein the ADC circuit comprises:
a comparator coupled to compare the output of the charge pump to the output of the DAC; and
a counter coupled to the comparator and to the N-bit register to update the digital startup value based on a comparison of the outputs of the charge pump and the DAC.

4. The apparatus of claim 1, wherein the fast lock circuit further includes:
a digital input selectively coupled to the N-bit register to upload the digital startup value into the N-bit register; and
a digital output coupled to the N-bit register to output the digital startup value from the fast lock circuit.

5. The apparatus of claim 1, wherein the first circuit comprises a delay lock loop ("DLL") and the delay cells are coupled in series to form a delay chain, the DLL further including:
a phase detector having a first input coupled to a first one of the delay cells and a second input coupled to a last one of the delay cells, the phase detector coupled to control the charge pump.

6. The apparatus of claim 5, wherein the operational bias voltage output from the charge pump comprises a first bias voltage for biasing negative-type transistors within the delay cells, the DLL further including:
a bias circuit to generate a second bias voltage for biasing positive-type transistors within the delay cells, the bias circuit responsive to the output of the charge pump.

7. The apparatus of claim 1, wherein the first circuit comprises a phase lock loop ("PLL") and the delay cells comprise inverters coupled in a loop to form a voltage controlled oscillator ("VCO"), the PLL further including:
a divide by M circuit to divide the output clock signal by M; and
a phase detector having a first input coupled to receive the input clock signal and a second input coupled to the divide by M circuit, the phase detector coupled to control the charge pump.

8. The apparatus of claim 7, wherein the operational bias voltage output from the charge pump comprises a first bias voltage for biasing a first conductive type of transistors within the VCO, the PLL further including:
a bias circuit to generate a second bias voltage for biasing a second conductivity type of transistors within the VCO, the bias circuit responsive to the output of the charge pump.

9. A method, comprising:
storing a digital startup value;
converting the digital startup value into an analog startup bias voltage;
precharging an output of a charge pump with the analog startup bias voltage;
enabling a phase detector, the charge pump, and delay cells, wherein the delay cells are initially biased with the startup bias voltage upon enablement;
biasing the delay cells with an operational bias voltage output from the charge pump after enabling the charge pump; and
feeding back an output of the delay cells to the phase detector to acquire a lock with an input signal.

10. The method of claim 9, further comprising successively approximating the operational bias voltage during operation of the charge pump to determine an updated digital startup value.

11. The method of claim 10, wherein successively approximating the operational bias voltage comprises:
comparing the operational bias voltage output from the charge pump to the analog startup bias voltage;
updating a counter based on results of the comparing to generate the updated digital startup value;
storing the updated digital startup value; and
converting the updated digital startup value into an updated analog startup bias voltage.

12. The method of claim 9, wherein the delay cells are coupled in series to form a delay chain and wherein the phase detector, the charge pump, and the delay chain comprise a delay lock loop ("DLL"), the method further comprising:
outputting a plurality of phase delayed signals from the delay chain.

13. The method of claim 9, wherein the delay cells comprise inverters coupled in a loop to form a voltage controlled oscillator ("VCO") and wherein the phase detector, the charge pump, and the VCO comprise elements of a delay lock loop ("PLL"), the method further comprising:
dividing the output of the VCO by M prior to feeding the output of the VCO back to the phase detector.

14. The method of claim 9, further comprising scanning the digital startup value into an N-bit register.

15. The method of claim 10, further comprising:
outputting the updated digital startup value from an N-bit register storing the updated digital startup value; and
adjusting an input impedance of a circuit based on the updated digital value.

16. The method of claim 10, further comprising:
outputting the updated digital startup value from an N-bit register storing the updated digital startup value; and
adjusting driver circuitry to compensate for slew rate of the driver circuitry based on the updated digital value.

17. A system, comprising:
synchronous dynamic random access memory ("SDRAM") to store instructions; and
a processor coupled to the SDRAM to execute the instructions, the processor including:
a first circuit to receive an input clock signal and to generate an output clock signal responsive to the input clock signal, the first circuit including a charge pump and delay cells, the charge pump to generate an operational bias voltage during operation of the first circuit to control a delay of the delay cells; and
a fast lock circuit selectively coupled to an output of the charge pump to precharge the output of the charge pump with a startup bias voltage prior to enabling the charge pump, the fast lock circuit including:
an N-bit register to store a digital startup value; and
a digital-to-analog converter ("DAC") coupled to the N-bit register to convert the digital startup value to the startup bias voltage.

18. The system of claim 17, wherein the fast lock circuit further includes:
an analog-to-digital converter ("ADC") circuit coupled to the output of the charge pump and to an output of the DAC, the ADC coupled to compare the operational bias voltage to the startup bias voltage, the ADC further coupled to the N-bit register to update the digital startup value with a successively approximated value of the operational bias voltage.

19. The system of claim 18, wherein the processor further includes input/output ("I/O") circuitry, the I/O circuitry including:

an input port having input impedance circuitry coupled to receive the digital startup value and to adjust an input impedance of the input port in response to the digital startup value; and driver circuitry coupled to receive the digital startup value and adjust a slew rate of the driver circuitry in response to the digital startup value.

* * * * *